United States Patent
Zhang et al.

(10) Patent No.: US 7,525,441 B2
(45) Date of Patent: *Apr. 28, 2009

(54) INTELLIGENT LIFE TESTING METHODS AND APPARATUS FOR LEAKAGE CURRENT PROTECTION DEVICE WITH INDICATING MEANS

(75) Inventors: Feng Zhang, Shanghai (CN); Hongliang Chen, Shanghai (CN); Fu Wang, Yueqing Zhejiang (CN); Wusheng Chen, Yueqing Zhejiang (CN); Yulin Zhang, Shanghai (CN); Huaiyin Song, Yueqing Zhejiang (CN)

(73) Assignee: General Protecht Group, Inc., Zhejiang (CN)

( * ) Notice: Subject to any disclaimer, the term of this patent is extended or adjusted under 35 U.S.C. 154(b) by 278 days.

This patent is subject to a terminal disclaimer.

(21) Appl. No.: 11/588,017

(22) Filed: Oct. 26, 2006

(65) Prior Publication Data
US 2007/0146945 A1    Jun. 28, 2007

(30) Foreign Application Priority Data
Dec. 27, 2005    (CN)    ......... 2005 1 0132845

(51) Int. Cl.
G08B 21/00    (2006.01)
(52) U.S. Cl. .................................. 340/638
(58) Field of Classification Search ........ 340/638, 340/635, 653, 657, 384.1; 361/42; 324/500
See application file for complete search history.

(56) References Cited

U.S. PATENT DOCUMENTS

| | | | |
|---|---|---|---|
| 4,931,894 A | 6/1990 | Legatti | |
| 4,979,070 A | 12/1990 | Bodkin | |
| 5,053,931 A | 10/1991 | Rushing | |
| 5,063,516 A * | 11/1991 | Jamoua et al. | ......... 701/114 |
| 5,223,810 A | 6/1993 | Van Haaren | |
| 5,229,730 A | 7/1993 | Legatti et al. | |
| 5,334,939 A | 8/1994 | Yarbrough | |
| 5,363,269 A | 11/1994 | McDonald | |
| 5,418,678 A | 5/1995 | McDonald | |
| 5,448,443 A | 9/1995 | Muelleman | |
| 5,477,412 A | 12/1995 | Neiger et al. | |
| 5,541,800 A | 7/1996 | Misencik | |
| 5,642,248 A | 6/1997 | Campolo et al. | |
| 5,654,857 A | 8/1997 | Gershen | |
| 5,661,623 A | 8/1997 | McDonald et al. | |
| 5,673,360 A | 9/1997 | Scripps | |

(Continued)

*Primary Examiner*—Phung Nguyen
(74) *Attorney, Agent, or Firm*—Morris, Manning, & Martin LLP; Tim Tingkang Xia

(57) ABSTRACT

An apparatus for testing the life of a leakage current protection device having a leakage current detection circuit and a trip mechanism. In one embodiment, the apparatus includes a ground fault simulation circuit for generating a simulated ground fault during every negative half-wave of an AC power, a signature signal generating circuit for generating a signature signal reflecting the characteristic of the leakage current detection circuit and the trip mechanism, when the simulated ground fault is generated, and a life testing detection control circuit having a microcontroller and an alarm circuit. In operation, the life testing detection control circuit receives the signature signal from the signature signal generating circuit, analyzes the received signature signal to determine whether at least one fault exists in the leakage current detection circuit and the trip mechanism, and activates the alarm circuit if the at least one fault exists.

21 Claims, 4 Drawing Sheets

U.S. PATENT DOCUMENTS

| | | | |
|---|---|---|---|
| 5,684,272 A | 11/1997 | Gernhardt et al. | |
| 5,706,155 A | 1/1998 | Neiger et al. | |
| 5,729,417 A | 3/1998 | Neiger et al. | |
| 5,757,598 A | 5/1998 | Aromin | |
| 5,786,971 A | 7/1998 | Chan et al. | |
| 5,825,599 A | 10/1998 | Rosenbaum | |
| 5,841,615 A | 11/1998 | Gershen | |
| 5,899,761 A | 5/1999 | Crane et al. | |
| 5,906,517 A | 5/1999 | Crane et al. | |
| 5,963,406 A | 10/1999 | Neiger et al. | |
| 5,963,408 A | 10/1999 | Neiger et al. | |
| 6,021,034 A | 2/2000 | Chan et al. | |
| 6,040,967 A | 3/2000 | DiSalvo | |
| 6,052,265 A | 4/2000 | Zaretsky et al. | |
| 6,052,266 A | 4/2000 | Aromin | |
| 6,128,169 A | 10/2000 | Neiger et al. | |
| 6,147,617 A * | 11/2000 | Kim | 340/664 |
| 6,226,161 B1 | 5/2001 | Neiger et al. | |
| 6,246,558 B1 | 6/2001 | DiSalvo et al. | |
| 6,252,407 B1 | 6/2001 | Gershen | |
| 6,259,340 B1 | 7/2001 | Fuhr et al. | |
| 6,262,871 B1 | 7/2001 | Nemir et al. | |
| 6,282,070 B1 | 8/2001 | Ziegler et al. | |
| 6,292,337 B1 | 9/2001 | Legatti et al. | |
| 6,339,525 B1 | 1/2002 | Neiger et al. | |
| 6,381,112 B1 | 4/2002 | DiSalvo | |
| 6,381,113 B1 | 4/2002 | Legatti | |
| 6,407,469 B1 | 6/2002 | Cline et al. | |
| 6,407,893 B1 | 6/2002 | Neiger et al. | |
| 6,433,555 B1 | 8/2002 | Leopold et al. | |
| 6,437,700 B1 | 8/2002 | Herzfeld et al. | |
| 6,437,953 B2 | 8/2002 | DiSalvo et al. | |
| 6,437,955 B1 | 8/2002 | Duffy et al. | |
| 6,442,007 B1 | 8/2002 | Li | |
| 6,465,735 B2 | 10/2002 | May | |
| 6,515,564 B2 | 2/2003 | Leopold et al. | |
| 6,532,139 B2 | 3/2003 | Kim et al. | |
| 6,538,862 B1 | 3/2003 | Mason, Jr. et al. | |
| 6,540,533 B1 | 4/2003 | Schreiber | |
| 6,577,478 B2 | 6/2003 | Kim et al. | |
| 6,611,406 B2 | 8/2003 | Neiger et al. | |
| 6,643,108 B2 | 11/2003 | Cline et al. | |
| 6,646,838 B2 | 11/2003 | Ziegler et al. | |
| 6,657,834 B2 | 12/2003 | DiSalvo | |
| 6,671,145 B2 | 12/2003 | Germain et al. | |
| 6,697,238 B2 | 2/2004 | Bonilla et al. | |
| 6,724,589 B1 | 4/2004 | Funderburk | |
| 6,734,680 B1 | 5/2004 | Conard | |
| 6,734,769 B1 | 5/2004 | Germain et al. | |
| 6,747,367 B2 | 6/2004 | Cline et al. | |
| 6,771,152 B2 | 8/2004 | Germain et al. | |
| 6,788,504 B2 | 9/2004 | Vanderkolk | |
| 6,813,126 B2 | 11/2004 | DiSalvo et al. | |
| 6,828,886 B2 | 12/2004 | Germain et al. | |
| 6,850,394 B2 | 2/2005 | Kim | |
| 6,859,044 B2 | 2/2005 | Hughes | |
| 6,864,766 B2 | 3/2005 | DiSalvo et al. | |
| 6,867,954 B2 | 3/2005 | Wu et al. | |
| 6,873,231 B2 | 3/2005 | Germain et al. | |
| 6,897,381 B2 | 5/2005 | He et al. | |
| 6,915,992 B1 | 7/2005 | Gretz | |
| 6,944,001 B2 | 9/2005 | Ziegler et al. | |
| 6,946,935 B2 | 9/2005 | Wu et al. | |
| 6,949,994 B2 | 9/2005 | Germain et al. | |
| 6,949,995 B2 | 9/2005 | Leopold et al. | |
| 6,954,125 B2 | 10/2005 | Wu et al. | |
| 6,958,463 B1 | 10/2005 | Kochman et al. | |
| 6,963,260 B2 | 11/2005 | Germain et al. | |
| 6,972,572 B2 | 12/2005 | Mernyk et al. | |
| 6,975,492 B2 | 12/2005 | DiSalvo | |
| 6,982,856 B2 | 1/2006 | Bernstein | |
| 6,991,495 B1 | 1/2006 | Aromin | |
| 7,256,701 B2 * | 8/2007 | Kono et al. | 340/648 |
| 2004/0037018 A1 * | 2/2004 | Kim | 361/42 |
| 2004/0070899 A1 * | 4/2004 | Gershen et al. | 361/42 |
| 2006/0198066 A1 | 9/2006 | Chen et al. | |

\* cited by examiner

INTELLIGENT LIFE TESTING METHODS AND APPARATUS FOR LEAKAGE CURRENT PROTECTION DEVICE WITH INDICATING MEANS

CROSS-REFERENCE TO RELATED APPLICATION

This application claims priority of Chinese Patent Application No. 200510132845.7, filed on Dec. 27, 2005, entitled "Intelligent Life Testing Methods and Apparatus for Leakage Current Protection Device" by Feng ZHANG, Hongliang CHEN, Fu WANG, Wusheng CHEN, Yulin ZHANG and Huaiyin SONG, the disclosure of which is incorporated herein by reference in its entirety.

This application is related to four co-pending U.S. patent applications, entitled "Apparatus and Methods for Testing the Life of a Leakage Current Protection Device," by Feng ZHANG, Hongliang CHEN, Fu WANG, Wusheng CHEN, Yulin ZHANG and Huaiyin SONG, Ser. No. 11/588,016; "Intelligent Life Testing Methods and Apparatus for Leakage Current Protection," by Feng ZHANG, Hongliang CHEN, Fu WANG, Wusheng CHEN, Yulin ZHANG and Huaiyin SONG; Ser. No. 11/588,163; "Intelligent Life Testing Methods and Apparatus for Leakage Current Protection," by Wusheng CHEN, Fu WANG, and Lianyun WANG; Ser. No. 11/588,046; and "Intelligent Life Testing Methods and Apparatus for Leakage Current Protection," by Feng ZHANG, Hongliang CHEN, Fu WANG, Wusheng CHEN, Yulin ZHANG and Huaiyin SONG, Ser. No. 11/588,048, respectively. The above identified co-pending applications were filed on the same day that this application was filed, and with the same assignee as that of this application. The disclosures of the above identified co-pending applications are incorporated herein by reference in their entireties.

FIELD OF THE PRESENT INVENTION

The present invention generally relates to real time detection of fault with an alarming device of a leakage current protection device for appliances. More particularly, the present invention relates to intelligent life testing methods and apparatus for a leakage current protection device with indicating means.

BACKGROUND OF THE PRESENT INVENTION

Leakage current protection can be divided into two categories according to their functionalities: ground fault circuit interrupter (hereinafter "GFCI") and arc fault circuit interrupter (hereinafter "AFCI"). In order to achieve the goal of leakage current protection, a leakage current protection device used for appliances comprises at least two components: a trip mechanism and a leakage current detection circuit. The trip mechanism comprises a silicon controlled rectifier (hereinafter "SCR"), trip coil, and trip circuit interrupter device. The leakage current detection circuit comprises induction coils, a signal amplifier and a controller.

The operating principle of a GFCI used for appliances is as follows. In a normal condition, the electric current on a hot wire of an electrical socket should be the same as the electric current on a neutral wire in the same electrical socket. When a leakage current occurs, there exists a current differential between the hot wire and the neutral wire of the electrical socket. The inductive coil of the leakage current protection device monitors the current differential and transfers the current differential into a voltage signal. The voltage signal is then amplified by the signal amplifier and sent to the controller. If the current differential exceeds a predetermined threshold, the controller sends a control signal to the trip circuit interrupter to cut off the connection between the AC power and the appliance to prevent damage caused by the leakage current.

For an AFCI used for appliances, in a normal condition, the electric current on a hot wire of an electrical socket should be the same as the electric current on a neutral wire in the same electrical socket, and the variation of both the electric current is same. When an arc fault occurs due to aging or damages of the AFCI device, the current or voltage between the hot wire and the neutral wire of the electrical socket exhibits a series of repeated pulse signals. The inductive coil of the arc fault protection device detects the pulse signals and converts the pulse signals to a voltage signal. The voltage signal is amplified by the signal amplifier and sent to the controller. If the amplitude of the pulse signals or the their occurring frequency exceed certain predetermined threshold, the controller sends a control signal to the trip circuit interrupter to cut off the connection between the AC power and the appliance to prevent further damage caused by the arc fault.

Leakage current protection devices have been widespreadly used because of their superior performance. However, the leakage protection devices may fail to provide such leakage current protection, if they are installed improperly and/or they are damaged due to aging. If a faulty controller can not output a correct control signal, or a trip mechanism fails to cut off the electric connection between the AC power and the appliance, the leakage current protection device will not be able to provide the leakage current protection, which may cause further damages or accidents. Although most leakage current protection devices are equipped with a manual testing button, usually, users seldom use the manual testing button. Therefore, the leakage current protection devices need an additional circuit to automatically detect malfunctions, faults or the end of the life of such devices. The great relevance would be gained if a leakage current protection device is capable of automatically detecting a fault therein or its end of the life, and consequently alerting a user to take an appropriate action including repairing or replacing the leakage current detection circuit.

Therefore, a heretofore unaddressed need exists in the art to address the aforementioned deficiencies and inadequacies.

SUMMARY OF THE PRESENT INVENTION

In one aspect, the present invention relates to an apparatus for testing the life of a leakage current protection device. The leakage current protection device has a first input, a second input, a third input, a first output, a second output, a third output, a reset circuit having an input and an output electrically coupled to the third input and the first output, respectively, a trip coil circuit having an input electrically coupled to the output of the reset circuit and the first output, a first output electrically coupled to the second output and a second output, and a signature signal generating unit having a first input electrically coupled to the first input, a second input electrically coupled to the second output of the trip coil circuit, and an output electrically coupled to the third output.

In one embodiment, the apparatus includes a microcontroller unit (MCU) having a first input electrically coupled to the second output of the leakage current protection device, a second input, a first output electrically coupled to the third input of the leakage current protection device, a second output, and a power supply input P; a signal conversion circuit having an input electrically coupled to the third output of the leakage current protection device, and an output electrically coupled to the second input of the MCU; an alarm circuit having an input electrically coupled to the second output of the MCU, and a power supply input; a power supply circuit having an input electrically coupled to the first output of the leakage current protection device, and an output electrically coupled to the power supply input P of the MCU and the power supply input of the alarm circuit; and a ground fault simulation unit having an input and an output electrically coupled to the first input and the second input of the leakage current protection device, respectively.

In one embodiment, the signal conversion circuit comprises a first resistor having two terminals electrically coupled to the input and the output, respectively, a second resistor two terminals with one electrically coupled to a DC power supply Vcc and the other electrically coupled to the output, and a capacitor having two terminals with one electrically coupled to the output and the other electrically coupled to the ground of the leakage current protection device, wherein the input to the signal conversion circuit is a DC voltage.

In one embodiment, the MCU is programmed such that if the DC voltage is greater than the predetermined threshold value, no fault exists in the leakage current protection device, and if the DC voltage is less than the predetermined threshold value, at least one fault exists in the leakage current protection device. The MCU sends an alarm signal to the alarm circuit when the MCU determines that at least one fault exists, and the alarm circuit receives the alarm signal and generates an alarm. The alarm circuit comprises at least one of an audio alarm circuit 202 for generating an audible alarm and a visual alarm circuit 203 for generating a visible alarm.

In operation, the ground fault simulation unit generates a series of simulated ground faults, the signature signal generating unit generates a DC voltage indicating the working condition of the leakage current protection device, the signal conversion circuit receives the DC voltage corresponding to the signal to be received by the second input of the MCU, and the MCU compares the DC voltage with a predetermined threshold value to determine whether a fault exists in the leakage current protection device, and activates the alarm circuit if at least one fault exists.

In another aspect, the present invention relates to a method for testing the life of a leakage current protection device, wherein the leakage current protection device has a first input, a second input, a third input, a first output, a second output, a third output, a reset circuit having an input and an output electrically coupled to the third input and the first output, respectively, a trip coil circuit having an input electrically coupled to the output of the reset circuit and the first output, a first output electrically coupled to the second output and a second output, and a signature signal generating unit having a first input electrically coupled to the first input, a second input electrically coupled to the second output of the trip coil circuit, and an output electrically coupled to the third output.

In one embodiment, the method comprises the step of providing a testing device having: (a) a microcontroller unit (MCU) having a first input that is electrically coupled to the second output of the leakage current protection device, a second input, a first output that is electrically coupled to the third input of the leakage current protection device, a second output, and a power supply input P; (b) a signal conversion circuit having an input that is electrically coupled to the third output of the leakage current protection device, and an output that is electrically coupled to the second input of the MCU; (c) an alarm circuit having an input that is electrically coupled to the second output of the MCU, and a power supply input; (d) a power supply circuit having an input that is electrically coupled to the first output of the leakage current protection device, and an output that is electrically coupled to the power supply input P of the MCU and the power supply input of the alarm circuit; and (e) a ground fault simulation unit having an input that is electrically coupled to the first input of the leakage current protection device, and an output that is electrically coupled to the second input of the leakage current protection device.

The method further comprises the step of generating a simulated ground fault by the ground fault simulation unit during every negative half-wave of an AC power; providing the simulated ground fault to the leakage current protection device; receiving a DC voltage at the input of the signal conversion circuit; processing the DC voltage by the signal conversion circuit to generate an output signal to the second input of the MCU; comparing the value of the DC voltage to a predetermined threshold value by the MCU to determine whether a fault exists in the leakage current protection device, wherein the MCU is programmed such that if the DC voltage is greater than the predetermined threshold value, no fault exists in the leakage current protection device, and if the DC voltage is less than the predetermined threshold value, a fault exists in the leakage current protection device; activating the alarm circuit by the MCU if a fault exists in the leakage current protection device to generate an alarm to alert users of the leakage current protection device. In one embodiment, the step of activating the alarm circuit comprises at least of one of following steps: activating an audio alarm circuit 202 for generating an audible alarm; and activating a visual alarm circuit 203 for generating a visible alarm.

In yet another aspect, the present invention relates to a leakage current protection device 300 with intelligent life testing. In one embodiment, the leakage current protection device 300 includes a leakage current protection circuit having a first input, a second input, a third input, a first output, a second output, a third output, a reset circuit having an input that is electrically coupled to the third input, and an output that is electrically coupled to the first output, a trip coil circuit having an input that is electrically coupled to the output of the reset circuit and the first output, a first output that is electrically coupled to the second output, and a second output, and a signature signal generating unit having a first input that is electrically coupled to the first input, and a second input that is electrically coupled to the second output of the trip coil circuit, and an output that is electrically coupled to the third output.

The leakage current protection device further includes a microcontroller unit (MCU) having a first input that is electrically coupled to the second output of the leakage current protection device, a second input, a first output that is electrically coupled to the third input of the leakage current protection device, a second output, and a power supply input P; a signal conversion circuit having an input that is electrically coupled to the third output of the leakage current protection device, and an output that is electrically coupled to the second input of the MCU; an alarm circuit having an input that is electrically coupled to the second output of the MCU, and a power supply input; a power supply circuit having an input that is electrically coupled to the first output of the leakage current protection device, and an output that is electrically coupled to the power supply input P of the MCU and the power supply input of the alarm circuit; and a ground fault simulation unit having an input that is electrically coupled to the first input of the leakage current protection device, and an output that is electrically coupled to the second input of the leakage current protection device.

In one embodiment, the signal conversion circuit comprises a first resistor having two terminals electrically coupled to the input and the output, respectively, a second resistor two terminals with one electrically coupled to a DC power supply Vcc and the other electrically coupled to the output, and a capacitor having two terminals with one electrically coupled to the output and the other electrically coupled to the ground of the leakage current protection device, wherein the input to the signal conversion circuit is a DC voltage.

In one embodiment, the MCU is programmed such that if the DC voltage is greater than the predetermined threshold value, no fault exists in the leakage current protection device, and if the DC voltage is less than the predetermined threshold value, at least one fault exists in the leakage current protection device. The MCU sends an alarm signal to the alarm circuit when the MCU determines that at least one fault exists, and the alarm circuit receives the alarm signal and generates an alarm. The alarm circuit comprises at least one of an audio alarm circuit for generating an audible alarm and a visual alarm circuit for generating a visible alarm.

In operation, the ground fault simulation unit generates a series of simulated ground faults, the signature signal generating unit generates a DC voltage indicating the working condition of the leakage current protection device, the signal conversion circuit receives the DC voltage corresponding to the signal to be received by the second input of the MCU, and the MCU compares the DC voltage with a predetermined threshold value to determine whether a fault exists in the leakage current protection device, and activates the alarm circuit if at least one fault exists.

In a further aspect, the present invention relates to an apparatus for testing the life of a leakage current protection device having a leakage current detection circuit and a trip mechanism. In one embodiment, the apparatus includes a ground fault simulation circuit having a diode having an anode and a cathode, and a resistors, wherein the resistor is electrically connected between a line phase terminal of an AC power supply and the cathode of the diode, and the anode of the diode is electrically coupled to a line neutral terminal of an AC power supply. In one embodiment, the ground fault simulation circuit is adapted for generating a simulated ground fault during every negative half-wave of the AC power. In another embodiment, the ground fault simulation circuit is adapted for generating a simulated ground fault during every positive half-wave of the AC power.

The apparatus further includes a signature signal generating circuit for generating a signature signal reflecting the characteristic of the leakage current detection circuit and the trip mechanism, when the simulated ground fault is received from the ground fault simulation unit. In one embodiment, the signature signal generating circuit has a diode having an anode and a cathode that is electrically connected to the line phase terminal of the AC power supply; a trip coil S1 having a first and second terminals, wherein the first terminal is electrically connected to the anode of the diode; a resistor having a first and second terminals, wherein the first terminal is electrically connected to the second terminal of the trip coil, and the second terminal is electrically coupled to the life testing detection control circuit; a switching device having a gate, an anode and a cathode, wherein the gate is electrically connected to both the leakage current detection circuit and the life testing detection control circuit, and the anode and cathode are electrically connected to the second terminal of the trip coil and the ground, respectively; a first to third capacitors, wherein the first capacitor is electrically connected between the gate and cathode of the switching device, the second capacitor is electrically connected between the second terminal of the resistor and the cathode of the switching device, and the third capacitor is electrically connected between the first terminal of the trip coil and the cathode of the switching device. The switching device comprises a silicon controlled rectifier or a transistor. The signature signal generating circuit is configured such that when the switching device is in the conductive state, the third capacitor, the switching device and the trip coil form a resonance circuit, and the resistor and the second capacitor form a signature signal generator that receives a signal of the resonance circuit so as to generate a signature signal that reflects the characteristic of the leakage current detection circuit and/or the trip mechanism.

The apparatus also includes a life testing detection control circuit having a microcontroller unit (MCU) for receiving the signature signal from the signature signal generating unit, analyzing the received signature signal so as to determine whether at least one fault exists in the leakage current detection circuit and the trip mechanism, and generating an alarm signal the at least one fault exists in the leakage current detection circuit and the trip mechanism.

The apparatus may includes an alarm circuit electrically coupled to the life testing detection control circuit for receiving the alarm signal, wherein the alarm circuit comprises an audio alarm circuit and/or a visual alarm circuit.

In yet a further aspect, the present invention relates to a method for testing the life of a leakage current protection device having a leakage current detection circuit and trip mechanism. In one embodiment, the method comprises the steps of: generating a simulated ground fault during every negative half-wave of an AC power; generating a signature signal when the simulated ground fault is generated, the signature signal having the characteristic of the leakage current detection circuit and trip mechanism; and analyzing the generated signature signal to determine whether at least one fault occurs in the leakage current detection circuit or trip mechanism. The method further comprises the step of generating an alarm signal when the at least one fault exists in the leakage current detection circuit or trip mechanism.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

Figure 1:
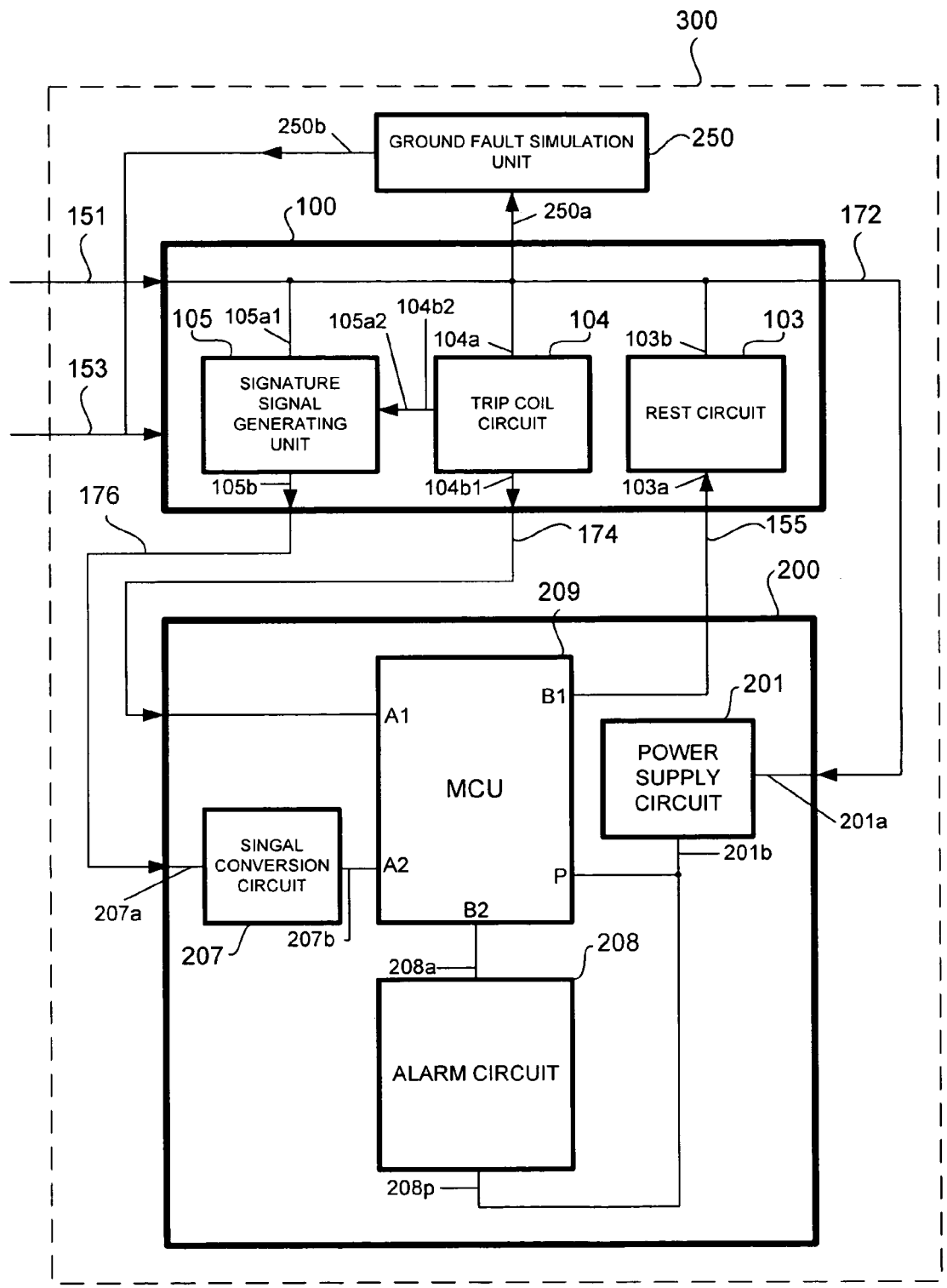
FIG. 1 shows a block diagram of an apparatus for testing the life of a leakage current protection device according to one embodiment of the present invention.

2, when the trip coil is short-circuited, according to one embodiment of the present invention.

DETAILED DESCRIPTION OF THE PRESENT INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention. Additionally, some terms used in this specification are more specifically defined below.

Definitions

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. Whether or not a term is capitalized is not considered definitive or limiting of the meaning of a term. As used in the description herein and throughout the claims that follow, a capitalized term shall have the same meaning as an uncapitalized term, unless the context of the usage specifically indicates that a more restrictive meaning for the capitalized term is intended. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "unit" and "circuit" are interchangeable, and refer to a configuration of electrically or electromagnetically electrically coupled components or devices.

The term "switch" or "switching device", refers to a device for changing the course (or flow) of a circuit, i.e., a device for making or breaking an electric circuit, or for selecting between multiple circuits. As used herein, a switch or switching device has two states: a conductive state and a non-conductive state. When the switching device is in the conductive state, a current is allowed to pass through. When the switching device is in the non-conductive state, no current is allowed to pass through.

As used herein, short names, acronyms and/or abbreviations "AC" refers to alternate current; "DC" refers to direct current; "AFCI" refers to arc fault circuit interrupter; "GFCI" refers to ground fault circuit interrupter; "LED" refers to light emitting diode; "MCU" refers to microcontroller unit; and "SCR" refers to silicon controlled rectifier.

Overview of the Invention

The present invention, among other things, discloses an apparatus and method for testing the life of a leakage current protection device. The leakage current protection device has a leakage current detection circuit and a trip mechanism having a switch device. The switch device has a gate, an anode and a cathode. The leakage current detection circuit of the leakage current protection device has two inductive coils adapted for detecting a leakage current. In one embodiment, the apparatus includes a ground fault simulation unit for generating a simulated ground fault during every cycle of an AC power, a signature signal generating unit for the leakage current protection device for generating a signature signal reflecting the signature of the leakage current detection circuit and the trip mechanism, when the simulated ground fault is received from the ground fault simulation unit, and a life testing detection control unit having an MCU and an alarm unit, wherein, in operation, the life testing detection control unit receives the signature signal from the signature signal generating unit, and analyzes the received signature signal to determine whether at least one fault exists in the leakage current detection circuit and the trip mechanism. In other words, the apparatus of the present invention in operation detects a leakage current in the leakage current protection device, compares the leakage current with a predetermined threshold and consequently outputs a leakage current protection (and/or alarm) signal if a fault occurs and/or the life of leakage current protection device reaches its end. In this sense, the invented apparatus is corresponding to an intelligently testing apparatus of the life of devices.

A silicon controlled rectifier (SCR) constitutes a key component of the trip mechanism of the leakage current protection device. In such a device, when a leakage current or arc fault occurs, the conduction of the current through the SCR must be guaranteed. Otherwise, the trip coil circuit is broken and the trip mechanism fails to operate properly.

It is experimentally showed that a proper operation of the trip mechanism depends not only on whether the trip coil conducts current, but also on the other conditions such as the current level and the duration of current conduction. The current level must be strong enough and the duration of current conduction must be long enough. Since the trip coil and the SCR are electrically coupled to a 110 to 240V AC power, the descending edge of the positive cycle of the AC power is selected to turn on the SCR when the instant value exceeds a pre-determined value. While the SCR is set in its conductive state, the leakage current detection circuit is tested to determine whether the current passes through the SCR. Immediately after the SCR is turned on, the AC power crosses zero volt level and enters the negative cycle, the SCR is turned off. Since the SCR is turned on only for a very brief moment, the current passing through the SCR is small enough to ensure the trip mechanism is not tripped.

In addition to a switching device (e.g. an SCR), the trip mechanism also includes a trip coil and a trip switch. The trip switch has to two pairs of terminals. One pair is corresponding to a pair of LINE terminals (a first and second LINE terminals) for connecting to an AC power source and the other pair is corresponding to a pair of LOAD terminals (a first and second LOAD terminals) for connecting to one or more electrical appliances. When the trip switch is in the conductive state, the first LINE terminal is electrically coupled to the first LOAD terminal and the second LINE terminal is electrically coupled to the second LOAD terminal, respectively. When the trip switch is in the non-conductive state, the first and second LINE terminals are electrically decoupled from the first and second LOAD terminal, respectively. One of the first and second LINE terminals is a line phase terminal and the other is a line neutral terminal. The trip switch is operated by the trip coil. When the trip switch is set in its conductive state, a current is allowed to pass through, that is, the AC power at the pair of LINE terminals is connected from the pair of LOAD terminals. When the trip switch is set in its non-conductive state, the AC power at the pair of LINE terminals is disconnected from the pair of LOAD terminals.

According to the present invention, the apparatus detects faults within the leakage current detection circuit for the leakage current protection device and the trip mechanism in the real time for testing the life of the leakage current protection device. In a descending edge of every positive half-wave of an AC power, or at a predetermined time, the apparatus sets the switching device SCR in its conductive state in a substantially short period of time, and tests whether the leakage current detection circuit for the leakage current protection device and the trip mechanism work properly. Shortly after the SCR is set in the conductive state, the voltage of the AC power crosses the zero line and thus sets the switching device SCR into its non-conductive state. The duration of the switching device SCR in the conductive state is so short such that the current passing through is not strong enough to activate the trip mechanism. If they are not working properly, at least one of an audio alarm circuit and a visual alarm circuit is activated. The present invention can be found many applications in different types of leakage current protection devices including GFCI and AFCI.

These and other aspects of the present invention are further described below.

Implementations and Examples of the Invention

Without intent to limit the scope of the invention, exemplary configurations and their related results according to the embodiments of the present invention are given below. Note again that titles or subtitles may be used in the examples for convenience of a reader, which in no way should limit the scope of the invention.

Figure 2:
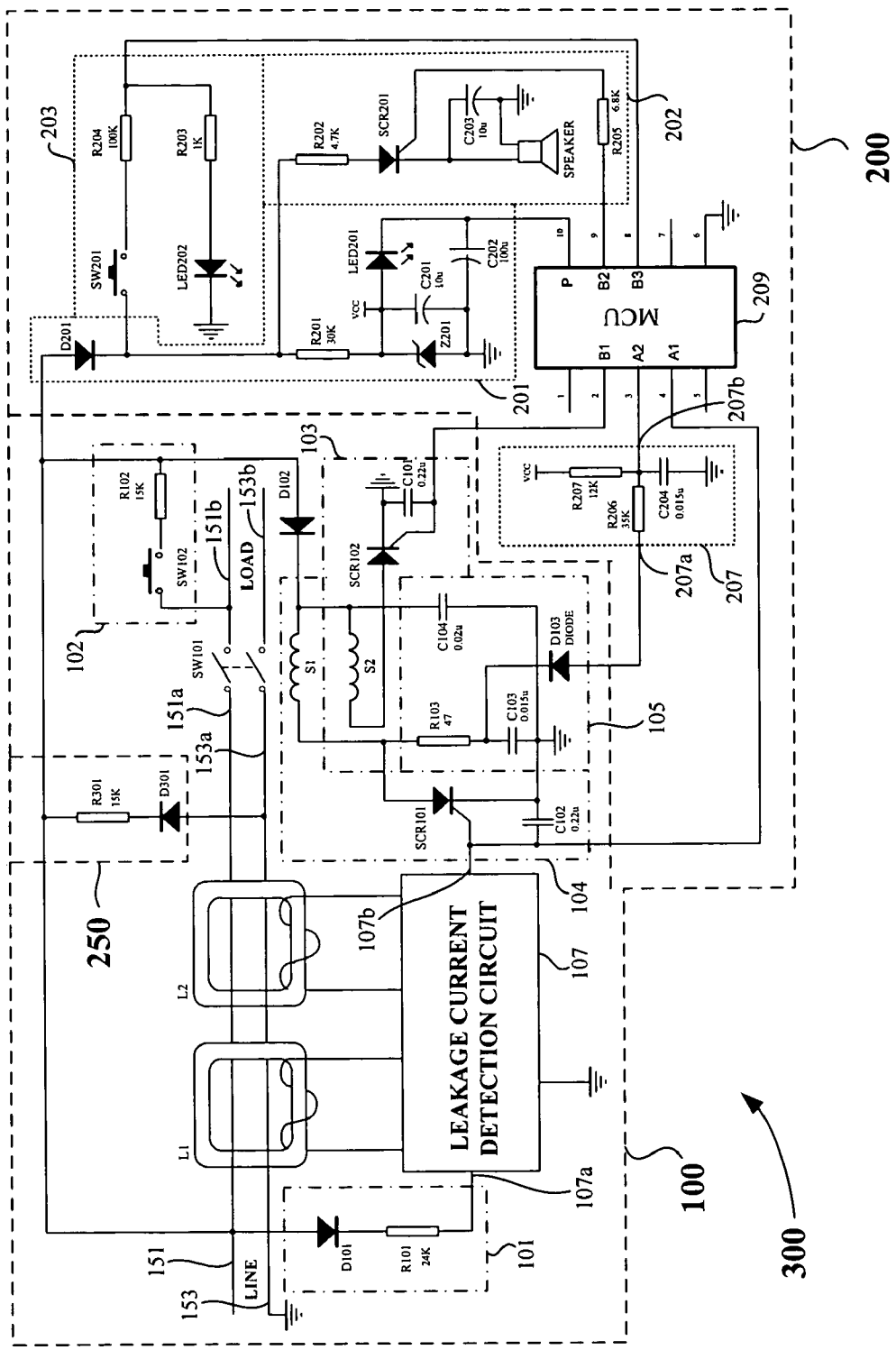
FIG. 2 shows a circuit diagram of an apparatus for testing the life of a leakage current protection device according to one embodiment of the present invention.

Referring to FIGS. 1 and 2, and first to FIG. 1, a block diagram of an apparatus for intelligently testing the life of a leakage current protection device is shown according to one embodiment of the present invention. The leakage current protection device 100 has a first input 151, a second input 153, a third input 155, a first output 172, a second output 174, a third output 176, a reset circuit 103 having an input 103a and an output 103b electrically coupled to the third input 155 and the first output 172, respectively, a trip coil circuit 104 having an input 104a electrically coupled to the output 103b of the reset circuit 103 and the first output 172, a first output 104b1 electrically coupled to the second output 174 and a second output 104b2, and a signature signal generating unit 105 having a first input 105a1 electrically coupled to the first input 151, a second input 105a2 electrically coupled to the second output 104b2 of the trip coil circuit 104, and an output 105b electrically coupled to the third output 176.

The apparatus 300 includes a microcontroller unit (MCU) 209 having a first input A1 electrically coupled to the second output 174 of the leakage current protection device 100, a second input A2, a first output B1 electrically coupled to the third input 155 of the leakage current protection device 100, a second output B2, and a power supply input P; a signal conversion circuit 207 having an input 207a electrically coupled to the third output 176 of the leakage current protection device 100, and an output 207b electrically coupled to the second input A2 of the MCU 209; an alarm circuit 208 having an input 208a electrically coupled to the second output B2 of the MCU 209, and a power supply input 208p; a power supply circuit 201 having an input 201a electrically coupled to the first output 172 of the leakage current protection device 100, and an output 201b electrically coupled to the power supply input P of the MCU 209 and the power supply input 208p of the alarm circuit 208; and a ground fault simulation unit 250 having an input 250a and an output 250b electrically coupled to the first input 151 and the second input 153 of the leakage current protection device 100, respectively.

The signal conversion circuit 207 has a first resistor R206 having two terminals electrically coupled to the input 207a and the output 207b, respectively, a second resistor R207 two terminals with one electrically coupled to a DC power supply Vcc and the other electrically coupled to the output 207b, and a capacitor C204 having two terminals with one electrically coupled to the output 207b and the other electrically coupled to the ground of the leakage current protection device 100, wherein the input to the signal conversion circuit 207 is a DC voltage.

The MCU 209 is programmed such that if the DC voltage is greater than the predetermined threshold value, no fault exists in the leakage current protection device 100, and if the DC voltage is less than the predetermined threshold value, at least one fault exists in the leakage current protection device 100. The MCU 209 sends an alarm signal to the alarm circuit 208 when the MCU 209 determines that at least one fault exists, and the alarm circuit 208 receives the alarm signal and generates an alarm. The alarm circuit 208 comprises at least one of an audio alarm circuit 202 for generating an audible alarm and a visual alarm circuit 203 for generating a visible alarm.

In operation, the ground fault simulation unit 250 generates a series of simulated ground faults, the signature signal generating unit 105 generates a DC voltage indicating the working condition of the leakage current protection device 100, the signal conversion circuit 207 receives the DC voltage corresponding to the signal to be received by the second input A2 of the MCU 209, and the MCU 209 compares the DC voltage with a predetermined threshold value to determine whether a fault exists in the leakage current protection device 100, and activates the alarm circuit 208 if at least one fault exists.

FIG. 2 shows a circuit diagram of an apparatus for testing the life of a leakage current protection device according to one embodiment of the present invention. The apparatus 300 includes a ground fault simulation unit 250 for generating a simulated ground fault during every cycle of an AC power, a leakage current protection circuit 100 having a signature signal generating unit 105 for generating a signal reflecting the signature of the leakage current detection circuit and the trip mechanism, in response to a simulated ground fault received from the ground fault simulation unit 250 and a life testing detection control unit 200 having an MCU and an alarm unit 202 and/or 203.

The ground fault simulation unit 250 has a diode D301 having an anode and a cathode, and a resistors R301. The resistor R301 is electrically connected between the hot wire (through the line phase terminal 151) of an AC power supply and the cathode of the diode D301. The anode of the diode D301 is connected to the line neutral terminal 153a of the trip switch SW101 which is electrically connected to the neutral wire 153 of the AC power supply after passing through two inductive coils L1 and L2. For such a configuration, only the negative half-waves of the AC power are passed through the diode D301. The ground fault simulation unit 250 is adapted for generating a simulated ground fault during every cycle of the AC power.

The leakage current protection circuit 100 has two inductive coils L1 and L2 for detecting a leakage current, a leakage current detecting circuit 107, a half-wave rectification circuit 101, a manual testing circuit 102, a reset circuit 103, a trip coil circuit 104, a signature signal generating unit 105, a resonance circuit and a trip switch SW101. The trip switch SW101 has a pair of LINE terminals (a line phase terminal 151a and a line neutral terminal 153a) in one side and a pair of LOAD terminals 151b and 153b in another side. The line phase terminal 151a and the line neutral terminal 153a pass through both inductive coils L1 and L2 and are electrically connected to a line phase terminal 151 and a line neutral terminal 153, respectively, of an AC power supplier. The pair of LOAD terminals 151b and 153b is electrically connected to one or more loads. When the trip switch SW101 is in its conductive state, the AC power is supplied from the LINE terminals to the LOAD terminals. When the trip switch SW101 is in its non-conductive state, no power is supplied from the pair of LINE terminals to the pair of LOAD terminals. Each of inductive coils L1 and L2 is electrically coupled to the leakage current detection circuit 107.

The half-wave rectification circuit 101 includes a rectifier diode D101 having a cathode and an anode electrically connected to the line phase terminal 151, and a current limiting resistor R101 having two terminals with one electrically connected to the cathode of the rectifier diode D101 and the other electrically connected to an input 107a of the leakage current detection circuit 107. The line phase terminal 151 is corresponding to the first input of the leakage current protection device 100, while the line neutral terminal 153 is corresponding to the second input of the leakage current protection device 100, as shown in FIG. 1. The half-wave rectification circuit 101 provides a DC power to the leakage current detection circuit 107.

The manual testing circuit 102 has a push-on release-off switch SW102 having two terminals and a resistor R102 having two terminals with one electrically coupled to the line phase terminal 151 and the other electrically connected to one terminal of the push-on release-off switch SW102, whose other terminal is electrically connected to a LOAD terminal 151b of the trip switch SW101. The LOAD terminal 151b of the trip switch SW101 is electrically connected to the line phase terminal 151a of the trip switch SW101 when the trip switch SW101 is in its conductive state. In this embodiment, the push-on release-off switch SW102 and the resistor R102 are connected in series. The manual testing circuit 102 is adapted for manually testing the leakage current protection device.

The reset circuit 103 comprises a switching device SCR102 having a gate, an anode and a cathode, a capacitor C101 having two terminals and a reset coil S2 having two terminals. As shown in FIG. 2, the switching device SCR102 and the reset coil S2 are connected in series, and the switching device SCR102 and the capacitor C101 are connected in parallel. Specifically, the reset coil S2 has its one terminal electrically connected to the cathode of a diode D102 whose anode is electrically connected to the line phase terminal 151 and the other terminal electrically connected to the anode of the switching device SCR102, and the capacitor C101 has one terminal electrically connected to the gate of the switching device SCR102 and the other terminal electrically connected to the cathode of the switching device SCR102, which is grounded. The gate of the switching device SCR102 is in turn electrically connected to a pin 2 (B1) of the MCU 209. An input signal to the gate of the switching device SCR102 makes the switching device SCR102 either in its conductive or its non-conductive state. When the switching device SCR102 is in the conductive state, the reset coil S2 is electrically coupled to an AC power supply (through the line phase terminal 151) and the reset coil S2 maintains the trip switch SW101 in the conductive state such that the AC power is connected from the LINE terminals 151a and 153a to the LOAD terminals 151b and 153b of trip switch SW101.

The trip coil circuit 104 comprises a switching device SCR101 having a gate, an anode and a cathode, a capacitor C102 having two terminals, and a trip coil S1 having two terminals, as shown in FIG. 2. The switching device SCR101 comprises an SCR or a transistor. The trip coil S1 has one terminal electrically connected to the cathode of a diode D102 whose anode is electrically connected to the line phase terminal 151 and the other terminal electrically connected to the anode of the switching device SCR101. The capacitor C102 has its one terminal electrically connected to the gate of the switching device SCR101 and the other terminal electrically connected to the cathode of the switching device SCR101, respectively. The cathode of the switching device SCR101 is grounded, as shown in FIG. 2. Furthermore, the gate of the switching device SCR101 is electrically connected to both the output 107b of the leakage current detection circuit 107 and a pin 4 (A1) of the MCU 209.

The signature signal generating unit 105 comprises two capacitors C103 and C104, a resistor R103, and a diode D103 having an anode and a cathode. Each of the two capacitors C103 and C104 and the resistor R103 has two terminals. As shown in FIG. 2, the resistor R103 has its one terminal electrically connected to the anode of the switching device SCR101 of the trip coil circuit 104, which is electrically connected to one terminal of the trip coil S1 of the trip coil circuit 104, and the other terminal electrically connected to the cathode of the diode D103 whose anode is electrically connected to the input 207a of a signal conversion circuit 207. The capacitor C103 has its one terminal connected the cathode of the diode D103 and the other terminal electrically connected to the ground. The capacitor C104 has its one terminal connected the cathode of the diode D102, which is electrically connected to the other terminal of the trip coil S1, and the other terminal electrically connected to the ground.

The trip switch SW101 responds to the action of the trip coil S1 and the reset coil S2. When the leakage current detection circuit 107 detects a leakage current fault, the detected signal from the leakage current detection circuit 107 is input to the gate of the switching device SCR101 of the trip coil circuit 104 and this signal causes the switching device SCR101 to be in its conductive state. The power supply energizes the trip coil S1 to trip the switch SW101 to break the AC power connection from the LINE to the LOAD, i.e. in a trip state. The reset circuit 103, on the other hand, energizes the reset coil S2 through the switching device SCR102 to reset the trip switch SW101 back to a normal conductive state to connect the AC power from the LINE to the LOAD.

The intelligent life testing and alarm circuit 200 comprises an MCU 209, a power supply 201 for the MCU 209, an audio alarm circuit 202, a visual alarm circuit 203, a signal conversion circuit 207.

The MCU 209 includes a general purpose integrated circuit with a timer function or an application specific integrated circuit such as a 555 timer chip.

The power supply circuit 201 comprises a rectifying diode D201, a resistor R201, a regulator diode Z201, a first voltage stabilizing capacitor C201, a second voltage stabilizing capacitor C202, and a light emitting diode LED201. The anode of the diode D201 is electrically connected to the hot wire of the AC power through the line phase terminal 151. The cathode terminal of the diode D201 is electrically connected to a first end of the resistor R201. A second end of the resistor R201 is electrically connected to a terminal Vcc and provides a DC power supply voltage to the terminal Vcc. The regulator diode Z201 has its cathode and anode electrically connected to the terminal Vcc and the ground, respectively. The first voltage stabilizing capacitors C201 has its two terminals electrically connected to the electrically connected to the terminal Vcc and the ground, respectively, as well. The regulator diode Z201 and first voltage stabilizing capacitors C201 coupled to each other in parallel to form a voltage regulator to further regulate the voltage of the terminal Vcc. The light emitting diode LED201 has its anode electrically connected to the terminal Vcc and its cathode electrically connected to one terminal of the second voltage stabilizing capacitor C202, which is electrically connected to a pin 10 (P) of the MCU 209 for supplying the power from the power supply circuit 201 to the MCU 209. The other terminal of the second voltage stabilizing capacitor C202 is electrically connected to the anode of the regulator diode Z20, which is electrically connected to the ground. The regulator diode Z201 and the voltage stabilizing capacitor C202 are adapted for regulating the power supply to an appropriate voltage for the MCU 209. The LED201 may also be used as an indication of working conditions of the leakage current protection device unit 100.

The alarm unit includes an audio alarm circuit 202 and/or a visual alarm circuit 203.

In this embodiment shown in FIG. 2, the audio alarm circuit 202 has a speaker, a switching device SCR201, and a voltage dividing resistor R202. A transistor or an SCR may be used as the switching device, depending upon applications. A DC voltage output from the half-wave rectifier D201 is applied to the speaker through the voltage dividing resistor R202 and the switching device SCR201. Normally, the switching device SCR201 is in a non-conductive state and the speaker remains silent. When an output from the pin 9 (B2) of the MCU 209, electrically connected to the gate of the switching device SCR201 turns the switching device SCR201 to its conductive state, the speaker produces an audible alarm. An optional integrated circuit may be used to generate special alarm sounds.

In this embodiment shown in FIG. 2, the visual alarm circuit 203 has a resistor R203, a light emitting diode LED202, a switch SW201 and a resistor R204. The switch SW201 has its one terminal electrically connected to the cathode of the diode D201 of the power supply circuit 201 and the other terminal electrically connected to one terminal of the resistor R204 whose other terminal is electrically connected to the pin 8 (B3) of the MCU 209. The resistor R203 is electrically connected between the other terminal of the resistor R204 and the anode of the light emitting diode LED202 whose cathode is grounded. Normally, the output at the pin 8 (B3) of the MCU 209 is in a low voltage state and the LED202 is not lit. When the MCU 209 detects the malfunction of the leakage current detection circuit 107 or the trip coil S1, the output at the pin 8 of the MCU 209 is in a high voltage state, which causes the light emitting diode LED202 to generate a visible alarm. The switch SW201 is a mechanical contact switch associated with trip protections. When the leakage current protection device 100 trips, the switch SW201 is set in its conductive state, causing the lighting of the LED202. The lighting of the LED202 indicates either the leakage current protection device unit 100 is in a trip condition or the leakage current detection circuit 100 is not working properly.

The signal conversion circuit 207 comprises a diode D103, a first resistor R206, a second resistor R207, and a capacitor C204. The cathode of D103 is electrically connected to the output terminal of the signature signal generating unit 105. The anode of D103 is electrically connected to a first end of the first resistor R206. The second end of the first resistor R206 is electrically connected to the input pin 3 of the MCU 209. The second resistor R207 and the capacitor C204 are used to reduce the power supply to an appropriate voltage for the input signal to the MCU 209.

In operation, the ground fault simulation unit 250 generates a simulated ground fault signal during every cycle of the AC power. The signature generating unit 105 generates the signature signals of the leakage current detection device having the inductive coils L1 and L2, and the leakage current detection circuit 107 and the trip mechanism having the trip coil S1. The intelligent life testing control unit MCU 209 periodically receives and analyzes the signature signal from the signature signal generating unit 105 to determine whether at least one fault exists in the leakage current detection circuit and trip mechanism.

When the switching device SCR101 of the trip coil circuit 104 is in the conductive state, a resonance circuit is formed with the capacitor C104, the switching device SCR101 and the trip coil S1. A RC circuit (signature signal generator) is formed with the resistor R103 and the capacitor C103, which selectively receives signature signals of the resonance circuit so as to generate a signature signal that reflects the characteristic of the leakage current detection circuit 107 and/or the trip mechanism (mainly the trip coil S1), i.e. charging the capacitor C103 with a negative voltage from the resonance circuit, and generating the signature signal that reflects the characteristic of the leakage current detection circuit 107 and the trip circuit (mainly the trip coil S1). For example, if the trip coil S1 is short circuited, or its circuit is broken, when the occurrence of a simulated leakage current fault causes the switching device SCR101 in the conductive state, no resonance is generated between the capacitor C104 and the trip switch SW101. In this case, the signal received by the RC circuit is a signal that reflects the faults such as the short circuited trip coil S1 or a broken circuit. Similarly, if the leakage current detection circuit 107 is out of order, such as damaged, the signature signal generator (the RC circuit) generates only the signature signal that reflects the faults such as a broken leakage current detection circuit. Therefore, according to the present invention, it can be detected in real-time whether or not there are malfunctions and/or failures in the leakage current detection circuit 107 or the trip coil S1.

Figure 3:
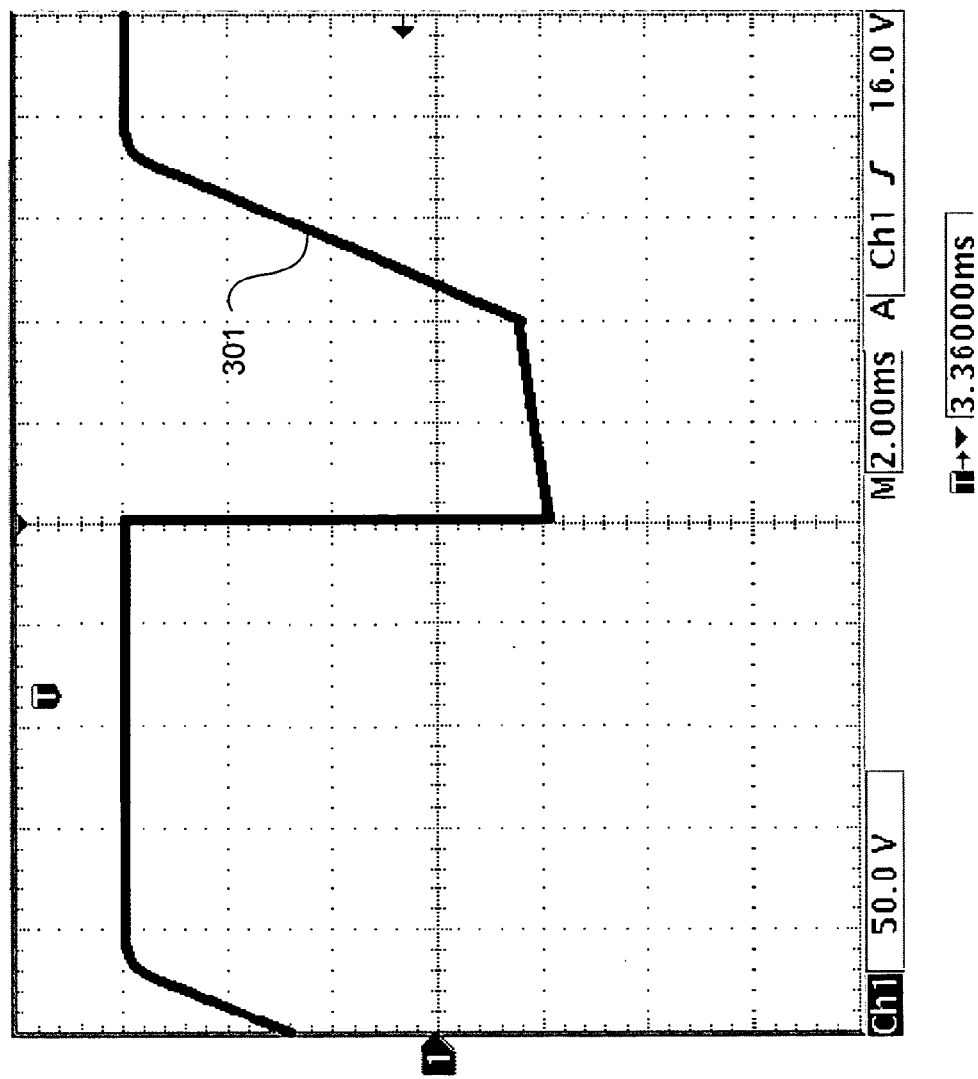
FIG. 3 shows the voltage measured from the capacitor C104 of the signature signal generating unit as shown in FIG. 2, when a leakage current detection circuit and trip mechanism work properly, according to one embodiment of the present invention.
Figure 4:
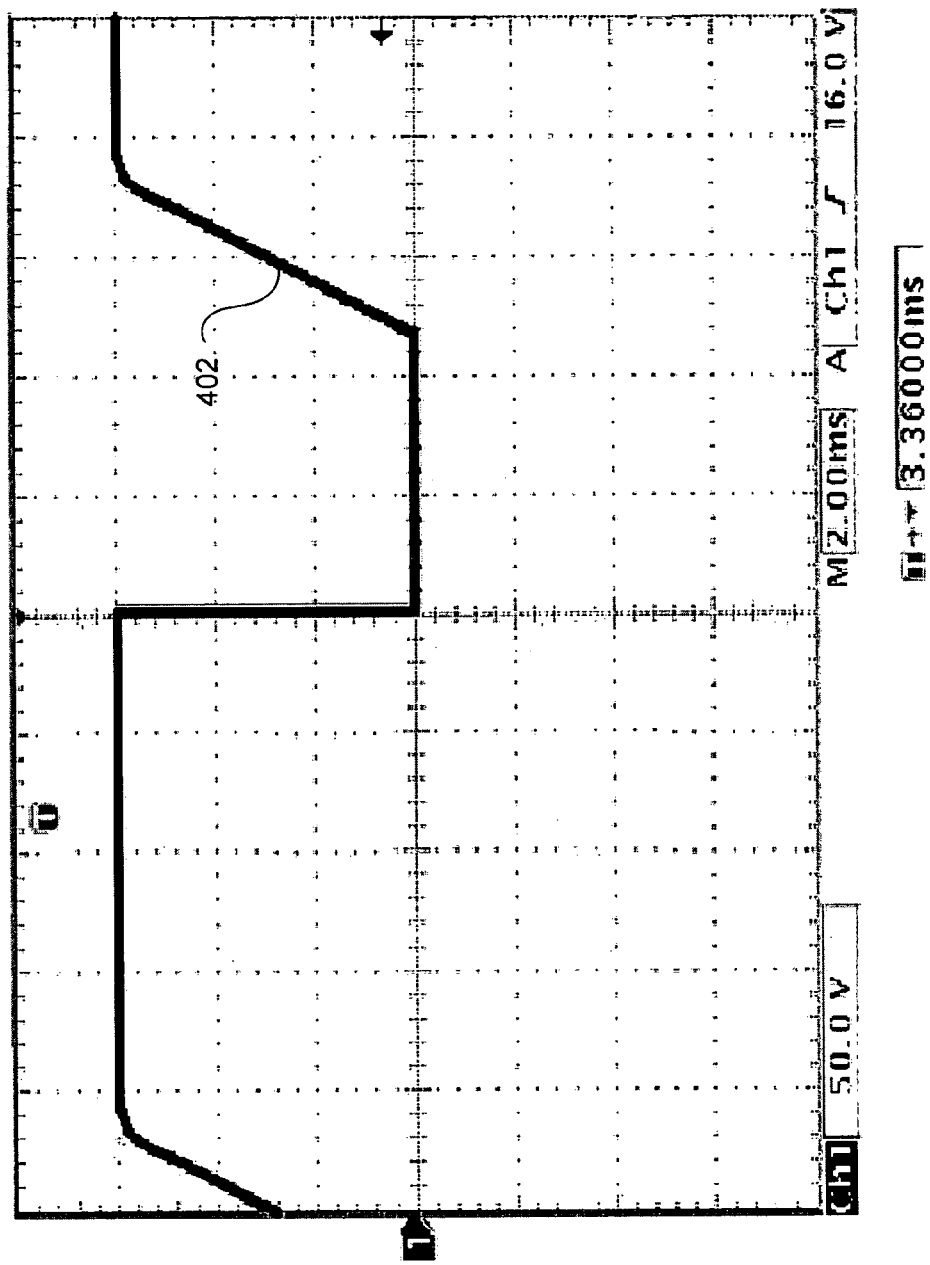
FIG. 4 shows the voltage measured from the capacitor C104 of the signature signal generating unit as shown in FIG.

For example, FIG. 3 shows the voltage 301 measured from the capacitor C104 of the signature signal generating unit, when a leakage current detection circuit and trip mechanism work properly, according to one embodiment of the present invention; and FIG. 4 shows the voltage 402 measured from the capacitor C104 of the signature signal generating unit, when the trip coil is short-circuited, according to one embodiment of the present invention.

When the life testing detection control unit MCU 209 determines that at least one fault occurs in the leakage current detection circuit, the MCU 209 sends a signal to set the switching device SCR101 in the conductive state. A DC current passes through the diode D102, the trip coil S1 and the switching device SCR101 to set the trip switch SW101 in the non-conductive state, i.e. in a trip state, thereby disconnecting the AC power from the LINE terminal to the LOAD terminal. Consequently, the MCU 209 generates one or more signals to activate the audio alarm circuit 202 and/or the visual alarm circuit 203.

Another aspect of the present invention provides a method of intelligently testing the life of a leakage current protection device having a leakage current detection circuit and a trip mechanism.

In one embodiment, the method comprises the steps of providing a life testing device 200 as described above; generating a simulated ground fault by the ground fault simulation unit 250 during every negative half-wave of an AC power; providing the simulated ground fault to the leakage current protection device 100; receiving a DC voltage at the input 207a of the signal conversion circuit 207; processing the DC voltage by the signal conversion circuit 207 to generate an output signal to the second input A2 of the MCU 209; comparing the value of the DC voltage to a predetermined threshold value by the MCU 209 to determine whether a fault exists in the leakage current protection device 100, wherein the MCU 209 is programmed such that if the DC voltage is greater than the predetermined threshold value, no fault exists in the leakage current protection device 100, and if the DC voltage is less than the predetermined threshold value, a fault exists in the leakage current protection device 100; activating the alarm circuit 208 by the MCU 209 if a fault exists in the leakage current protection device 100 to generate an alarm to alert users of the leakage current protection device 100. The step of activating the alarm circuit 208 comprises at least of one of following steps: activating an audio alarm circuit 202 for generating an audible alarm; and activating a visual alarm circuit 203 for generating a visible alarm.

In another embodiment, the method comprises the steps of:
generating a simulated ground fault by a ground fault simulator unit 250 during every negative half-wave of an AC power;
producing a signature signal by a signature signal generating unit 105 when the simulated ground fault occurs, the signature signal having the signature of the leakage current detection circuit and a trip mechanism;
receiving the signature signal from the signature signal generating unit 105 by a life testing detection control unit MCU; and
analyzing the received signature signal to determine whether at least one fault occurs in the leakage current detection circuit or the trip mechanism.

The step of generating signature signals that reflects the characteristic of the leakage current detection circuit and trip mechanism, performed with the signature signal generating unit of the leakage current protection circuit, comprises the steps of:

outputting a signal from the leakage current detection circuit to set a switching device SCR101 to its conductive state for allowing a current to pass through, when the leakage current detection circuit receives a simulated ground fault during every negative half-wave of the AC power;
causing a resonance within a resonance circuit having a trip coil S1, a first capacitor C104, when the switching device is in a conductive state for allowing a current to pass through and charging a second capacitor C103;
setting the switching device in its non-conductive state for not allowing a current to pass through during a second half of the AC power; and
generating a negative voltage across the second capacitor C103 by discharging the first capacitor C104 when the switching device is in a non-conductive state.

If the leakage current detection circuit and the trip circuit work properly, the resonance circuit is able to build the negative voltage across C103. If at least one fault exists in the leakage current detection circuit and the trip circuit, the resonance circuit is unable to build the negative voltage across C103. The negative voltage across C103 is the signature of the leakage current detection circuit and the trip circuit.

As shown in FIG. 2, a diode D301 in the ground fault simulator unit 250 becomes conductive during every negative half-wave of an AC power and a leakage current fault is generated for life testing detection accordingly.

The detection circuit 200 is a life testing detection control circuit built with a microcontroller unit MCU 209. The circuit 200 comprises a power supply circuit 201, an audio alarm circuit 202, a visual alarm circuit 203, and a signal conversion circuit 207.

The power supply circuit 201 uses a resistor voltage divider to supply power to the MCU from the hot wire of the AC Power. As shown in FIG. 2, since the power supply circuit 101 provides power to the controller of the leakage current protection device with half-cycle rectifier, the circuit 202 uses the same half-cycle rectifier circuit to supply power. In order to maintain a stable voltage, a voltage regulating diode Z201 and a capacitor C201 are used to form a voltage regulator. A light emitting diode LED201 and a capacitor C202 may be used to reduce the power supply to an appropriate voltage for the MCU 209.

The audio alarm circuit 202 comprises a buzzer, a switching device SCR201, and voltage dividing resistor R202. A transistor or an SCR may be used as the switching device depending on the applications. A DC voltage from the half-wave rectifier is applied to the buzzer through the voltage dividing resistor R202 and the switching device SCR201. When the switching device SCR201 is set to a conductive state, the speaker generates sound as alarm.

The visual alarm circuit 203 comprises a light emitting diode LED202 and current limiting resistors R203 and R204, and a switch SW201. The visual alarm circuit 203 is driven by the pin 8 of the MCU. The switch SW201 is a mechanical contact switch associated with the trip devices. When the leakage protection device trips, the SW201 is closed, causing the lighting of the LED202. The lighting of the LED202 indicates the trip condition.

The positive half-wave of the AC current charges the capacitor C104 as shown in the circuit 105 to its peak value. When the AC current enters its negative cycle, the diode D301 becomes conductive to generate a simulated leakage current fault. If the leakage current protection device works properly, the simulated leakage current fault is detected by the leakage current detection device and is used to turn on the switching device SCR101. Once the SCR101 is turned on, i.e. becoming conductive, the capacitor C104 discharges through the circuit having the trip coil S1 and the switching device SCR101. The trip coil S1 and the capacitor C104 form a resonance circuit. When the current passes through the trip coil S1, it forms an electromagnetic field around L1. As the discharging of the C104 continues, the strength of the electromagnetic field is reduced gradually. The resonance circuit then starts the charging in reverse direction until the AC current enters next positive cycle. During this reverse charging process, a negative voltage is formed across the capacitor C104 as shown in FIG. 2. This negative voltage charges the capacitor C103 to establish a negative voltage through a buffer circuit having a capacitor C103 and a resistor R103.

When at least one fault exists in the leakage current protection device, the discharging and charging processes will not be maintained, causing the failure of building the negative voltage across the capacitors C103 and C104. For example, if the trip coil S1 is short-circuited, the discharging of the capacitor C104 through SCR101 will not establish the electromagnetic field around the trip coil S1, disabling the reverse charging across the capacitor C103. The wave form of the voltage across the C103 is shown in FIG. 3.

The circuit 207 converts the negative voltage generated by the life testing detection circuit to a pulse signal recognizable by the MCU 209. If the pin 3 of the MCU 209 does not receive the pulse signal from the circuit 207 within a predetermined time period, during the normal operation of the MCU 209, the leakage current detection device is diagnosed to be faulty. An audio alarm and a visual alarm are generated to alert the user of the leakage current detection device. If the pin 3 of the MCU 209 receives the pulse signal from the circuit 207 regularly, the pulse signal to the pin 3 of the MCU 209 is periodically check by the MCU 209. Under normal circumstance, the pulse signal occurs once every cycle of the AC power. If the MCU 209 detects the pulse signal, an internal timer is reset, a timing period is started over again for detecting the next pulse signal. If the MCU 209 fails to detect the pulse signal, it indicates that at least one fault exists in the leakage current protection device. Such at least one fault causes an audio alarm and a visual alarm. In the meantime, the pin 4 of the MCU 209 sends out a signal to set the switching device SCR101 to a conductive state causing the leakage current protection to trip.

The method described herein has no impact to the normal operation of the leakage current protection device. The negative half-wave of the AC power can also be used to detect the malfunction of the leakage current protection device and the trip mechanism. In this case, the trip occurs during the next positive cycle of the AC power.

A general purpose integrated circuit with a timer function, an application specific integrated circuit such as a 555 timer chip can be used as the MCU 209.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An apparatus for testing the life of a leakage current protection device, wherein the leakage current protection device has a first input, a second input, a third input, a first output, a second output, a third output, a reset circuit having an input and an output electrically coupled to the third input and the first output, respectively, a trip coil circuit having an input electrically coupled to the output of the reset circuit and the first output, a first output electrically coupled to the second output and a second output, and a signature signal generating unit having a first input electrically coupled to the first input, a second input electrically coupled to the second output of the trip coil circuit, and an output electrically coupled to the third output, comprising:

(i) a microcontroller unit (MCU) having a first input electrically coupled to the second output of the leakage current protection device, a second input, a first output electrically coupled to the third input of the leakage current protection device, a second output, and a power supply input P;

(ii) a signal conversion circuit having an input electrically coupled to the third output of the leakage current protection device, and an output electrically coupled to the second input of the MCU;

(iii) an alarm circuit having an input electrically coupled to the second output of the MCU, and a power supply input;

(iv) a power supply circuit having an input electrically coupled to the first output of the leakage current protection device, and an output electrically coupled to the power supply input P of the MCU and the power supply input of the alarm circuit; and (v) a ground fault simulation unit having an input and an output electrically coupled to the first input and the second input of the leakage current protection device, respectively, wherein, in operation, the ground fault simulation unit generates a series of simulated ground faults, the signature signal generating unit generates a DC voltage indicating the working condition of the leakage current protection device, the signal conversion circuit receives the DC voltage corresponding to the signal to be received by the second input of the MCU, and the MCU compares the DC voltage with a predetermined threshold value to determine whether a fault exists in the leakage current protection device, and activates the alarm circuit if at least one fault exists.

2. The apparatus of claim 1, wherein the signal conversion circuit comprises a first resistor having two terminals electrically coupled to the input and the output, respectively, a second resistor two terminals with one electrically coupled to a DC power supply Vcc and the other electrically coupled to the output, and a capacitor having two terminals with one electrically coupled to the output and the other electrically coupled to the ground of the leakage current protection device, wherein the input to the signal conversion circuit is a DC voltage.

3. The apparatus of claim 2, wherein the MCU is programmed such that if the DC voltage is greater than the predetermined threshold value, no fault exists in the leakage current protection device, and if the DC voltage is less than the predetermined threshold value, at least one fault exists in the leakage current protection device.

4. The apparatus of claim 1, wherein the MCU sends an alarm signal to the alarm circuit when the MCU determines that at least one fault exists, and the alarm circuit receives the alarm signal and generates an alarm.

5. The apparatus of claim 4, wherein the alarm circuit comprises at least one of an audio alarm circuit for generating an audible alarm and a visual alarm circuit for generating a visible alarm.

6. A method for testing the life of a leakage current protection device, wherein the leakage current protection device has a first input, a second input, a third input, a first output, a second output, a third output, a reset circuit having an input and an output electrically coupled to the third input and the first output, respectively, a trip coil circuit having an input electrically coupled to the output of the reset circuit and the first output, a first output electrically coupled to the second output and a second output, and a signature signal generating unit having a first input electrically coupled to the first input, a second input electrically coupled to the second output of the trip coil circuit, and an output electrically coupled to the third output, comprising the steps of:
  (i) providing a testing device having:
    (a) a microcontroller unit (MCU) having a first input that is electrically coupled to the second output of the leakage current protection device, a second input, a first output that is electrically coupled to the third input of the leakage current protection device, a second output, and a power supply input P;
    (b) a signal conversion circuit having an input that is electrically coupled to the third output of the leakage current protection device, and an output that is electrically coupled to the second input of the MCU;
    (c) an alarm circuit having an input that is electrically coupled to the second output of the MCU, and a power supply input;
    (d) a power supply circuit having an input that is electrically coupled to the first output of the leakage current protection device, and an output that is electrically coupled to the power supply input P of the MCU and the power supply input of the alarm circuit; and
    (e) a ground fault simulation unit having an input that is electrically coupled to the first input of the leakage current protection device, and an output that is electrically coupled to the second input of the leakage current protection device,
  (ii) generating a simulated ground fault by the ground fault simulation unit during every negative half-wave of an AC power;
  (iii) providing the simulated ground fault to the leakage current protection device;
  (iv) receiving a DC voltage at the input of the signal conversion circuit;
  (v) processing the DC voltage by the signal conversion circuit to generate an output signal to the second input of the MCU;
  (vi) comparing the value of the DC voltage to a predetermined threshold value by the MCU to determine whether a fault exists in the leakage current protection device, wherein the MCU is programmed such that if the DC voltage is greater than the predetermined threshold value, no fault exists in the leakage current protection device, and if the DC voltage is less than the predetermined threshold value, a fault exists in the leakage current protection device;
  (vii) activating the alarm circuit by the MCU if a fault exists in the leakage current protection device to generate an alarm to alert users of the leakage current protection device.

7. The method of claim 6, wherein the activating the alarm circuit step further comprising at least of one of following steps:
  (i) activating an audio alarm circuit for generating an audible alarm; and
  (ii) activating a visual alarm circuit for generating a visible alarm.

8. A leakage current protection device with life testing, comprising:
  (i) a leakage current protection device having:
    (a) a first input;
    (b) a second input;
    (c) a third input;
    (d) a first output;
    (e) a second output;
    (f) a third output;
    (g) a reset circuit having an input that is electrically coupled to the third input, and an output that is electrically coupled to the first output;
    (h) a trip coil circuit having an input that is electrically coupled to the output of the reset circuit and the first output, a first output that is electrically coupled to the second output, and a second output; and
    (i) a signature signal generating unit having a first input that is electrically coupled to the first input, and a second input that is electrically coupled to the second output of the trip coil circuit, and an output that is electrically coupled to the third output;
  (ii) a microcontroller unit (MCU) having a first input that is electrically coupled to the second output of the leakage current protection device, a second input, a first output that is electrically coupled to the third input of the leakage current protection device, a second output, and a power supply input P;
  (iii) a signal conversion circuit having an input that is electrically coupled to the third output of the leakage current protection device, and an output that is electrically coupled to the second input of the MCU;
  (iv) an alarm circuit having an input that is electrically coupled to the second output of the MCU, and a power supply input;
  (v) a power supply circuit having an input that is electrically coupled to the first output of the leakage current protection device, and an output that is electrically coupled to the power supply input P of the MCU and the power supply input of the alarm circuit; and
  (vi) a ground fault simulation unit having an input that is electrically coupled to the first input of the leakage current protection device, and an output that is electrically coupled to the second input of the leakage current protection device,
wherein, in operation, the ground fault simulation unit generates a series of simulated ground faults, the signature signal generating unit generates a DC voltage indicating the working condition of the leakage current protection device, the signal conversion circuit receives the DC voltage corresponding to the signal to be received by second input of the MCU, and the MCU compares the DC voltage with a predetermined threshold value to determine whether a fault exists in the leakage current protection device, and activates the alarm circuit if at least one fault exists.

9. The leakage current protection device of claim 8, wherein the signal conversion circuit comprises a first resistor having a first terminal that is electrically coupled to the input and a second terminal that is electrically coupled to the output, a second resistor having a first terminal that is electrically coupled to the direct current power supply Vcc and a second terminal that is electrically coupled to the output, and a capacitor having a first terminal that is electrically coupled to the output, and a second terminal that is electrically coupled to the ground of the leakage current protection device, wherein the input to the signal conversion circuit is a DC voltage.

10. The leakage current protection device of claim 9, wherein the MCU is programmed such that if the DC voltage is greater than the predetermined threshold value, no fault exists in the leakage current protection device, and if the DC voltage is less than the predetermined threshold value, at least one fault exists in the leakage current protection device.

11. The leakage current protection device of claim 8, wherein the MCU sends an alarm signal to the alarm circuit when the MCU determines that at least one fault exists, and the alarm circuit receives the alarm signal and generates an alarm.

12. The leakage current protection device of claim 11, wherein the alarm circuit comprises at least one of an audio alarm circuit for generating an audible alarm and a visual alarm circuit for generating a visible alarm.

13. An apparatus for testing the life of a leakage current protection device having a leakage current detection circuit and a trip mechanism, comprising:
(i) a ground fault simulation circuit having a diode having an anode and a cathode, and a resistors, wherein the resistor is electrically connected between a line phase terminal of an AC power supply and the cathode of the diode, and the anode of the diode is electrically coupled to a line neutral terminal of an AC power supply;
(ii) a signature signal generating circuit for generating a signature signal reflecting the characteristic of the leakage current detection circuit and the trip mechanism, when the simulated ground fault is received from the ground fault simulation unit; and
(iii) a life testing detection control circuit having a microcontroller unit (MCU) for receiving the signature signal from the signature signal generating unit, analyzing the received signature signal so as to determine whether at least one fault exists in the leakage current detection circuit and the trip mechanism, and generating an alarm signal the at least one fault exists in the leakage current detection circuit and the trip mechanism.

14. The apparatus of claim 13, wherein the signature signal generating circuit comprises:
(i) a diode having an anode and a cathode that is electrically connected to the line phase terminal of the AC power supply;
(ii) a trip coil S1 having a first and second terminals, wherein the first terminal is electrically connected to the anode of the diode;
(iii) a resistor having a first and second terminals, wherein the first terminal is electrically connected to the second terminal of the trip coil, and the second terminal is electrically coupled to the life testing detection control circuit;
(iv) a switching device having a gate, an anode and a cathode, wherein the gate is electrically connected to both the leakage current detection circuit and the life testing detection control circuit, and the anode and cathode are electrically connected to the second terminal of the trip coil and the ground, respectively;
(v) a first to third capacitors, and, wherein the first capacitor is electrically connected between the gate and cathode of the switching device, the second capacitor is electrically connected between the second terminal of the resistor and the cathode of the switching device, and the third capacitor is electrically connected between the first terminal of the trip coil S1 and the cathode of the switching device, configured such that when the switching device is in the conductive state, the third capacitor, the switching device and the trip coil form a resonance circuit, and the resistor and the second capacitor form a signature signal generator that receives a signal of the resonance circuit so as to generate a signature signal that reflects the characteristic of the leakage current detection circuit and/or the trip mechanism.

15. The apparatus of claim 14, wherein the switching device comprises a silicon controlled rectifier or a transistor.

16. The apparatus of claim 13, wherein the ground fault simulation circuit is adapted for generating a simulated ground fault during every negative half-wave of the AC power.

17. The apparatus of claim 13, wherein the ground fault simulation circuit is adapted for generating a simulated ground fault during every positive half-wave of the AC power.

18. The apparatus of claim 13, further comprising an alarm circuit electrically coupled to the life testing detection control circuit for receiving the alarm signal.

19. The apparatus of claim 18, wherein the alarm circuit comprises an audio alarm circuit and/or a visual alarm circuit.

20. A method for testing the life of a leakage current protection device having a leakage current detection circuit and trip mechanism, comprising the steps of:
(i) generating a simulated ground fault during every negative half-wave of an AC power;
(ii) generating a signature signal when the simulated ground fault is generated, the signature signal having the characteristic of the leakage current detection circuit and trip mechanism; and
(iii) analyzing the generated signature signal to determine whether at least one fault occurs in the leakage current detection circuit or trip mechanism.

21. The method of claim 20, further comprising the step of generating an alarm signal when the at least one fault exists in the leakage current detection circuit or trip mechanism.

* * * * *